United States Patent
Portillo Rivera et al.

(10) Patent No.: US 11,976,002 B2
(45) Date of Patent: May 7, 2024

(54) METHODS FOR ENCAPSULATING SILVER MIRRORS ON OPTICAL STRUCTURES

(71) Applicant: Applied Materials, Inc., Santa Clara, CA (US)

(72) Inventors: Alexia Adilene Portillo Rivera, Santa Clara, CA (US); Andrew Ceballos, Santa Clara, CA (US); Kenichi Ohno, Sunnyvale, CA (US); Rami Hourani, Santa Clara, CA (US); Karl J. Armstrong, Sunnyvale, CA (US); Brian Alexander Cohen, Delmar, NY (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 300 days.

(21) Appl. No.: 17/141,813

(22) Filed: Jan. 5, 2021

(65) Prior Publication Data
US 2022/0212983 A1    Jul. 7, 2022

(51) Int. Cl.
C03C 17/36 (2006.01)
C23C 14/06 (2006.01)
C23C 14/08 (2006.01)
C23C 14/18 (2006.01)
C23C 14/34 (2006.01)

(52) U.S. Cl.
CPC ...... *C03C 17/3615* (2013.01); *C03C 17/3626* (2013.01); *C03C 17/3642* (2013.01); *C03C 17/3644* (2013.01); *C03C 17/3663* (2013.01); *C23C 14/0652* (2013.01); *C23C 14/08* (2013.01); *C23C 14/18* (2013.01); *C23C 14/3407* (2013.01); *C03C 2218/154* (2013.01)

(58) Field of Classification Search
None
See application file for complete search history.

(56) References Cited

U.S. PATENT DOCUMENTS

| | | | |
|---|---|---|---|
| 5,548,440 | A | 8/1996 | Hohenegger et al. |
| 5,751,474 | A | 5/1998 | Hohenegger et al. |
| 6,128,126 | A | 10/2000 | Hohenegger et al. |
| 6,156,382 | A | 12/2000 | Rajagopalan et al. |
| 6,162,715 | A | 12/2000 | Mak et al. |
| 6,264,336 | B1 | 7/2001 | Epstein et al. |
| 6,275,332 | B1 | 8/2001 | Hohenegger et al. |
| 6,309,713 | B1 | 10/2001 | Mak et al. |

(Continued)

FOREIGN PATENT DOCUMENTS

KR    20020055584 A    7/2002

OTHER PUBLICATIONS

International Search Report and Written Opinion dated Mar. 7, 2022 for Application No. PCT/US2021/059006.

*Primary Examiner* — Francisco W Tschen
(74) *Attorney, Agent, or Firm* — Patterson + Sheridan, LLP

(57) ABSTRACT

Embodiments of the present disclosure generally relate to encapsulated optical devices and methods for fabricating the encapsulated optical devices. In one or more embodiments, a method for encapsulating an optical device includes depositing a metallic silver layer on a substrate, depositing a barrier layer on the metallic silver layer, where the barrier layer contains silicon nitride, a metallic element, a metal nitride, or any combination thereof, and depositing an encapsulation layer containing silicon oxide on the barrier layer.

20 Claims, 1 Drawing Sheet

(56) References Cited

U.S. PATENT DOCUMENTS

| | | |
|---|---|---|
| 6,357,880 B2 | 3/2002 | Epstein et al. |
| 6,498,091 B1 | 12/2002 | Chen et al. |
| 6,508,560 B2 | 1/2003 | Epstein et al. |
| 6,551,929 B1 | 4/2003 | Kori et al. |
| 6,590,711 B1 | 7/2003 | Gardner et al. |
| 6,607,976 B2 | 8/2003 | Chen et al. |
| 6,620,723 B1 | 9/2003 | Byun et al. |
| 6,626,545 B2 | 9/2003 | Gardner et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,833,161 B2 | 12/2004 | Wang et al. |
| 6,838,125 B2 | 1/2005 | Chung et al. |
| 6,849,545 B2 | 2/2005 | Mak et al. |
| 6,872,429 B1 | 3/2005 | Chen et al. |
| 6,911,391 B2 | 6/2005 | Yang et al. |
| 6,936,538 B2 | 8/2005 | Byun |
| 6,951,804 B2 | 10/2005 | Seutter et al. |
| 7,026,238 B2 | 4/2006 | Xi et al. |
| 7,049,226 B2 | 5/2006 | Chung et al. |
| 7,101,795 B1 | 9/2006 | Xi et al. |
| 7,279,432 B2 | 10/2007 | Xi et al. |
| 7,416,979 B2 | 8/2008 | Yoon et al. |
| 7,521,379 B2 | 4/2009 | Khandelwal et al. |
| 7,601,652 B2 | 10/2009 | Singh et al. |
| 7,695,563 B2 | 4/2010 | Lu et al. |
| 7,964,505 B2 | 6/2011 | Khandelwal et al. |
| 8,498,047 B2 | 7/2013 | Ishihara et al. |
| 8,679,633 B2 | 3/2014 | Imran et al. |
| 8,895,149 B2 | 11/2014 | Imran et al. |
| 8,940,398 B2 | 1/2015 | Imran et al. |
| 9,085,485 B2 | 7/2015 | Imran et al. |
| 9,302,935 B2 | 4/2016 | Imran et al. |
| 9,434,643 B2 | 9/2016 | Imran et al. |
| 9,556,067 B2 | 1/2017 | Imran et al. |
| 9,624,127 B2 | 4/2017 | Imran et al. |
| 9,822,033 B2 | 11/2017 | Imran et al. |
| 2001/0019452 A1 | 9/2001 | Epstein et al. |
| 2001/0041440 A1* | 11/2001 | Endo ............... H01L 21/28518 257/E21.585 |
| 2002/0060354 A1* | 5/2002 | Nakagawa .......... H01L 21/7682 438/114 |
| 2002/0067547 A1 | 6/2002 | Epstein et al. |
| 2002/0162569 A1* | 11/2002 | Kuo ........................ B08B 7/00 134/1 |
| 2002/0175419 A1* | 11/2002 | Wang ...................... C25D 5/48 438/959 |
| 2003/0095332 A1 | 5/2003 | Gardner et al. |
| 2003/0123216 A1 | 7/2003 | Yoon et al. |
| 2003/0124262 A1 | 7/2003 | Chen et al. |
| 2003/0215570 A1 | 11/2003 | Seutter et al. |
| 2004/0009336 A1 | 1/2004 | Marcadal et al. |
| 2004/0013803 A1 | 1/2004 | Chung et al. |
| 2006/0281203 A1* | 12/2006 | Epler ................. H01L 33/0093 438/22 |
| 2007/0009658 A1 | 1/2007 | Yoo et al. |
| 2008/0206987 A1 | 8/2008 | Gelatos et al. |
| 2009/0233106 A1* | 9/2009 | Medwick ................ G02B 1/10 204/192.1 |
| 2010/0176475 A1* | 7/2010 | Sano ................... H01L 27/1464 257/E31.127 |
| 2010/0245991 A1 | 9/2010 | Ishihara et al. |
| 2012/0225304 A1 | 9/2012 | Imran et al. |
| 2013/0003206 A1 | 1/2013 | Kabagambe et al. |
| 2013/0117992 A1 | 5/2013 | Imran et al. |
| 2013/0193443 A1* | 8/2013 | Ito ....................... H01L 33/0095 438/29 |
| 2014/0147681 A1 | 5/2014 | Imran et al. |
| 2015/0072168 A1 | 3/2015 | Imran et al. |
| 2015/0125715 A1 | 5/2015 | Imran et al. |
| 2015/0321949 A1 | 11/2015 | Imran et al. |
| 2016/0075596 A1 | 3/2016 | Imran et al. |
| 2016/0221867 A1 | 8/2016 | Imran et al. |
| 2017/0129807 A1 | 5/2017 | Imran et al. |
| 2018/0065884 A1 | 3/2018 | Imran et al. |
| 2019/0018531 A1* | 1/2019 | Zhu ...................... G06F 3/0412 |

* cited by examiner

METHODS FOR ENCAPSULATING SILVER MIRRORS ON OPTICAL STRUCTURES

BACKGROUND

Field

Embodiments of the present disclosure generally relate to optical devices and methods for fabricating optical devices, and more specifically, to encapsulated optical devices and methods for fabricating the encapsulated optical devices.

Description of the Related Art

In optical devices, such as a virtual reality (VR) device or an augmented reality (AR) device, a waveguide combiner is often used to couple a virtual image, transport light inside a glass substrate through total internal reflection, and then couple the image when reaching the position of viewer's eye. For light coupling and decoupling, slanted features and trenches in the waveguide combiner are usually applied as gratings for light diffraction. The orientation of lines (fins) controls the light propagation direction, whereas the tilted angle controls the efficiency of desired orders of diffraction. Mirrors are used to reflect the light on a controlled manner.

In many applications, mirrors having silver layers are used in these optical devices. To protect the silver from long term oxidation, an encapsulation layer is often deposited on or over the silver layer. However, when the silver layer is exposed to an oxidizing environment, such as oxygen in a plasma reactor, the silver atoms often migrate into neighboring layers and or the substrate damaging the optical device. Migration is especially a problem to silicon oxide layers as well as glass or quartz substrates or wafers.

Therefore, there is a need for improved optical devices having mirrors and methods for fabricating such optical devices.

SUMMARY

Embodiments of the present disclosure generally relate to encapsulated optical devices and methods for fabricating the encapsulated optical devices. In one or more embodiments, a method for encapsulating an optical device includes depositing a metallic silver layer on a substrate, depositing a barrier layer on the metallic silver layer, where the barrier layer contains silicon nitride, one or more metallic elements, one or more metal nitrides, or any combination thereof, and depositing an encapsulation layer containing silicon oxide on the barrier layer.

In some embodiments, a method for encapsulating an optical device includes depositing a first barrier layer on a substrate, depositing a metallic silver layer on the first barrier layer, depositing a second barrier layer on the metallic silver layer, and depositing an encapsulation layer containing silicon oxide on the second barrier layer by a physical vapor deposition (PVD) process. Each of the first and second barrier layers independently contains silicon nitride, one or more metallic elements, one or more metal nitrides, or any combination thereof.

In other embodiments, an encapsulated optical device contains a first barrier layer disposed on a substrate, a metallic silver layer disposed on the first barrier layer, a second barrier layer disposed on the metallic silver layer, and an encapsulation layer containing silicon oxide disposed on the second barrier layer. The substrate is or contains glass, quartz, silicon dioxide, or fused silica. Each of the first and second barrier layers independently contains silicon nitride, one or more metallic elements, one or more metal nitrides, or any combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to encapsulated optical devices and methods for fabricating the encapsulated optical devices. The encapsulated optical devices can be or include devices or film stacks used as virtual reality (VR) devices, augmented reality (AR) devices, as well as other devices, including optical devices, display devices, and/or microelectronic devices.

Figure 1:
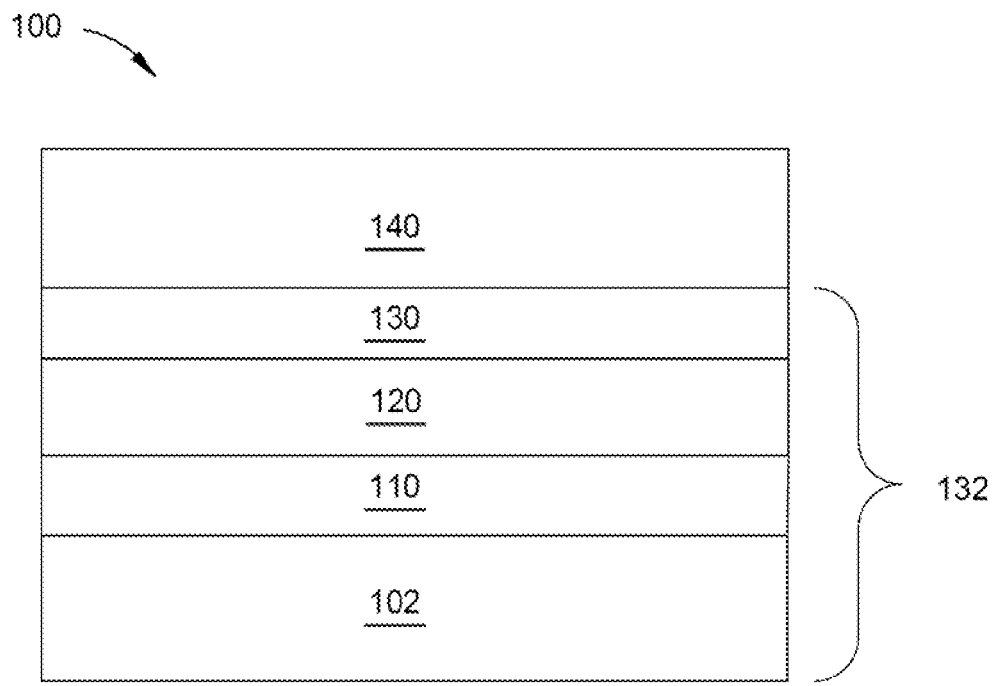
FIG. 1 depicts a schematic cross-sectional view of an encapsulated optical device, according to one or more embodiments described and discussed herein.

FIG. 1 depicts a schematic cross-sectional view of an encapsulated optical device 100, according to one or more embodiments described and discussed herein. The encapsulated optical device 100 contains a barrier layer 110 (e.g., a first or intermediate barrier layer) disposed on a substrate 102, a metallic silver layer 120 disposed on the barrier layer 110, a barrier layer 130 (e.g., a second barrier layer) disposed on the metallic silver layer 120, and an encapsulation layer 140 disposed on the second barrier layer 130. In one or more embodiments, an optical device 132 contains the substrate 102, the first barrier layer 110, the metallic silver layer 120, and the second barrier layer 130. The optical device 132 is encapsulated by the encapsulation layer 140 in order to produce the encapsulated optical device 100. The method for producing the encapsulated optical device 100 includes depositing the barrier layer 110 on the substrate 102, depositing a metallic silver layer 120 directly on the barrier layer 110, depositing the barrier layer 130 on the metallic silver layer 120, and depositing the encapsulation layer 140 containing silicon oxide on the barrier layer 130.

Figure 2:
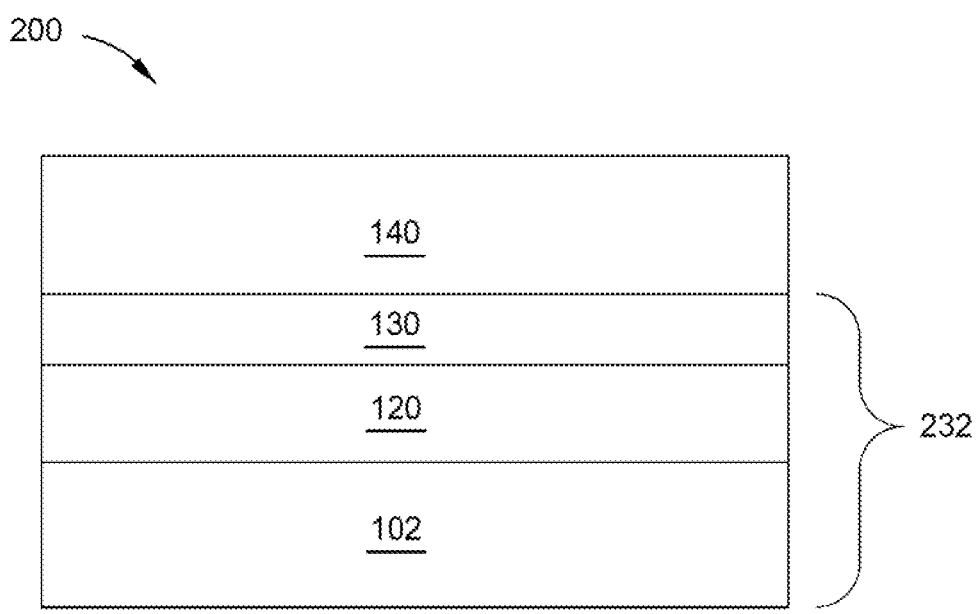
FIG. 2 depicts a schematic cross-sectional view of another encapsulated optical device, according to one or more embodiments described and discussed herein.

FIG. 2 depicts a schematic cross-sectional view of an encapsulated optical device 200, according to one or more embodiments described and discussed herein. The encapsulated optical device 200 is similar to the encapsulated optical device 100, but lacks the barrier layer 110. As such, the encapsulated optical device 200 contains the metallic silver layer 120 disposed on the substrate 102, the barrier layer 130 disposed on the metallic silver layer 120, and the encapsulation layer 140 containing silicon oxide disposed on the second barrier layer 130. In one or more embodiments, an optical device 232 contains the substrate 102, the metallic silver layer 120, and the barrier layer 130. The optical device 232 is encapsulated by the encapsulation layer 140 in order to produce the encapsulated optical device 200. The method for producing the encapsulated optical device 200 includes depositing the metallic silver layer 120 on the substrate 102, depositing the barrier layer 130 on the metallic silver layer 120, and depositing the encapsulation layer 140 containing silicon oxide on barrier layer 130.

For the encapsulated optical device 100, the barrier layer 110 protects the substrate 102 from being contaminated by silver atoms defusing from the metallic silver layer 120 during the subsequent deposition, plasma, and/or thermal processes. Without the barrier layer 110, silver atoms from the silver layer 120 would migrate into the substrate 102 damaging the optical device. However, with the barrier layer 110 disposed between the substrate 102 and the metallic silver layer 120, the barrier layer 110 reduces or eliminates silver migration into the substrate 102. For both of the encapsulated optical devices 100, 200, the barrier layer 130 protects the metallic silver layer 120 from plasma exposure and/or one or more oxidizing agents (e.g., ozone, oxygen plasma, or oxygen radicals) during the deposition of the encapsulation layer 140. In some examples, the plasma exposure and/or oxidizing agent can be generated while encapsulating the metallic silver layer 120. Without the barrier layer 130, once the silver layer 120 is exposed to plasma and/or an oxidizing agent, silver atoms from the silver layer 120 would migrate into neighboring layers and or the substrate damaging the optical device. However, with the barrier layer 130 disposed on or over the metallic silver layer 120, the metallic silver layer 120 is protected from silver migration.

In one or more embodiments, the substrate 102 is or contains glass, quartz, silicon dioxide, fused silica, one or more polymeric materials, or any combination thereof. In some examples, the substrate 102 is or contains a high refractive index (HRI) glass, an HRI polymeric material, or other HRI material. Exemplary HRI glass, the HRI polymeric material, or other HRI material can have a refractive index of greater than 1.5, such as about 1.6, about 1.7, about 1.8, about 1.9, or about 2 to about 2.1, about 2.2, about 2.3, about 2.4, about 2.5, about 2.6, about 2.7, about 2.8, or greater. In one or more examples, the HRI glass, the HRI polymeric material, or other HRI material can have a refractive index of about 1.6 to about 2.8, about 1.6 to about 2.5, about 1.6 to about 2.3, about 1.6 to about 2.2, about 1.6 to about 2.1, about 1.8 to about 2.8, about 1.8 to about 2.5, about 1.8 to about 2.3, about 1.8 to about 2.2, about 1.8 to about 2.1, about 2 to about 2.8, about 2 to about 2.5, about 2 to about 2.3, or about 2 to about 2.2.

In some embodiments, the substrate 102 can include a wafer or panel substrate capable of having material, layers, films, mirrors, and/or the like deposited thereon. The substrate 102 can include silicon (doped or undoped), crystalline silicon (e.g., Si<100> or Si<111>), strained silicon, silicon oxide, doped or undoped polysilicon, or the like, a germanium substrate, a silicon germanium substrate, a Group III-V compound substrate, such as a gallium arsenide substrate, a gallium nitride substrate, a silicon carbide substrate, a patterned or non-patterned semiconductor-on-insulator (SOI) substrate, a carbon-doped oxide, a silicon nitride, glass, sapphire, quartz, one or more polymeric materials, reflective materials (e.g., mirrors), an optical device, a virtual reality (VR) device, an augmented reality (AR) device, a solar array, solar or photovoltaic (PV) panel, a light emitting diode (LED) substrate, or any other materials such as metals, metal alloys, and other conductive materials, or any combination thereof. In some examples, the substrate 102 can include a plurality of layers or films, such as a semi-insulating material and a semiconducting material, where the semi-insulating material has a higher resistivity than the semiconducting material. The substrate 102 is not limited to any particular size or shape (e.g., round, rectangular, or square), or may have various dimensions. In some examples, the substrate 102 is round and has a diameter of 100 mm, 200 mm, 300 mm, 450 mm, or other diameter substrates.

Each of the barrier layers 110, 130 independently contains one or more materials, such as silicon nitride, one or more metallic elements, one or more metal nitrides, or combination thereof. In one or more examples, each of the barrier layers 110, 130 independently contains silicon nitride which can be deposited by PVD or another vapor deposition process (e.g., CVD or ALD). In some examples, each of the barrier layers 110, 130 independently contains metallic titanium, metallic chromium, metallic tantalum, metallic tungsten, metallic molybdenum, metallic vanadium, silicon, alloys thereof, dopants thereof, or any combination thereof. In other examples, each of the barrier layers 110, 130 independently contains titanium nitride, tantalum nitride, tungsten nitride, chromium nitride, molybdenum nitride, vanadium nitride, silicon nitride, alloys thereof, dopants thereof, or any combination thereof. The barrier layers 110, 130 can be deposited or otherwise formed by one or more processes or techniques, such as CVD, plasma-enhanced CVD (PE-CVD), sub-atmospheric CVD (SA-CVD), high density plasma CVD (HDP-CVD), flowable CVD (FCVD® processes), ALD, furnace or thermal ALD, thermal ALD, plasma-enhanced ALD (PE-ALD), PVD, sputtering, evaporation deposition, ion beam deposition, or any combination thereof.

Each of the barrier layers 110, 130 can independently have a thickness of about 1 nm, about 2 nm, about 5 nm, about 8 nm, about 10 nm, about 12 nm, or about 15 nm to about 18 nm, about 20 nm, about 25 nm, about 30 nm, about 35 nm, about 40 nm, about 45 nm, or about 50 nm. For example, each of the barrier layers 110, 130 can independently have a thickness of about 1 nm to about 50 nm, about 1 nm to about 40 nm, about 1 nm to about 30 nm, about 1 nm to about 35 nm, about 1 nm to about 30 nm, about 1 nm to about 25 nm, about 1 nm to about 20 nm, about 1 nm to about 15 nm, about 1 nm to about 12 nm, about 1 nm to about 10 nm, about 1 nm to about 5 nm, about 2 nm to about 25 nm, about 5 nm to about 50 nm, about 5 nm to about 40 nm, about 5 nm to about 30 nm, about 5 nm to about 35 nm, about 5 nm to about 30 nm, about 5 nm to about 25 nm, about 5 nm to about 20 nm, about 5 nm to about 15 nm, about 5 nm to about 12 nm, about 5 nm to about 10 nm, about 5 nm to about 8 nm, about 10 nm to about 50 nm, about 10 nm to about 40 nm, about 10 nm to about 30 nm, about 10 nm to about 35 nm, about 10 nm to about 30 nm, about 10 nm to about 25 nm, about 10 nm to about 20 nm, about 10 nm to about 15 nm, or about 10 nm to about 12 nm.

The metallic silver layer 120 contains metallic silver, which has a zero oxidation state. The metallic silver layer 120 can include other elements, but generally contains substantially or completely silver. In some embodiments, the metallic silver layer 120 contains at least 50 atomic percent (at %) metallic silver, such as about 60 at %, about 75 at %, about 80 at %, or about 85 at % to about 90 at %, about 95 at %, about 97 at %, about 98 at %, about 99 at %, about 99.5 at %, about 99.9 at %, or greater amount of metallic silver.

The metallic silver layer 120 can be deposited or otherwise formed by one or more processes or techniques, such as CVD, plasma-enhanced CVD (PE-CVD), sub-atmospheric CVD (SA-CVD), high density plasma CVD (HDP-CVD), flowable CVD (FCVD® processes), ALD, furnace or thermal ALD, plasma-enhanced ALD (PE-ALD), PVD, sputtering, evaporation deposition, ion beam deposition, or any combination thereof. In one or more examples, the metallic silver layer 120 can be deposited or otherwise formed from a silver target or silver alloy target by PVD or sputtering.

The metallic silver layer 120 has a thickness of about 10 nm, about 15 nm, about 20 nm, about 25 nm, about 30 nm, about 35 nm, about 40 nm, about 45 nm, or about 50 nm to about 55 nm, about 60 nm, about 70 nm, about 80 nm, about 90 nm, about 100 nm, about 120 nm, about 135 nm, about 150 nm, about 180 nm, about 200 nm, or thicker. For example, the metallic silver layer 120 has a thickness of about 10 nm to about 200 nm, about 10 nm to about 180 nm, about 10 nm to about 150 nm, about 10 nm to about 120 nm, about 10 nm to about 100 nm, about 10 nm to about 80 nm, about 10 nm to about 60 nm, about 10 nm to about 50 nm, about 10 nm to about 40 nm, about 10 nm to about 20 nm, about 20 nm to about 200 nm, about 20 nm to about 180 nm, about 20 nm to about 150 nm, about 20 nm to about 120 nm, about 20 nm to about 100 nm, about 20 nm to about 80 nm, about 20 nm to about 60 nm, about 20 nm to about 50 nm, about 20 nm to about 40 nm, about 40 nm to about 200 nm, about 40 nm to about 180 nm, about 40 nm to about 150 nm, about 40 nm to about 120 nm, about 40 nm to about 100 nm, about 40 nm to about 80 nm, about 40 nm to about 60 nm, about 40 nm to about 50 nm, or about 50 nm to about 60 nm.

The encapsulation layer 140 contains one or more materials for encapsulating or protecting the underlying layers, namely the optical devices 132, 232. In one or more embodiments, the encapsulation layer 140 contains silicon oxide (e.g., silicon dioxide), aluminum oxide, magnesium oxide, dopants thereof, or any combination thereof. In some examples, the encapsulation layer 140 is deposited or otherwise formed by one or more vapor deposition processes which utilize plasma, such as a PVD or sputtering process, a furnace CVD (FCVD) process, a PE-CVD process, a PE-ALD process, or other plasma process. During the deposition of the encapsulation layer 140, a silicon source (e.g., a silicon target or a silicon precursor) is reacted with an oxygen source, oxygen precursor, and/or oxidizing agent (e.g., ozone, atomic oxygen, oxygen-plasma, oxygen ($O_2$), water, hydrogen peroxide, or any combination thereof). In one or more examples, the encapsulation layer 140 is deposited by a PVD process which includes generating ozone or an oxygen plasma while depositing the encapsulation layer 140. For example, silicon oxide is deposited in a magnetron sputtering PVD chamber using a silicon target and depositing reactively with a plasma containing argon and oxygen ($Ar/O_2$). In other examples, the encapsulation layer 140 is deposited by RF sputtering of a dielectric target. An exemplary PVD chamber or system for depositing the encapsulation layer 140, as well as other layers described and discussed herein, is the PVD Endura® tool, commercially available from Applied Materials, Inc.

The encapsulation layer 140 has a thickness of about 10 nm, about 15 nm, about 20 nm, about 25 nm, about 30 nm, about 35 nm, about 40 nm, about 45 nm, or about 50 nm to about 55 nm, about 60 nm, about 70 nm, about 80 nm, about 90 nm, about 100 nm, about 120 nm, about 135 nm, about 150 nm, about 180 nm, about 200 nm, or thicker. For example, the encapsulation layer 140 has a thickness of about 10 nm to about 200 nm, about 10 nm to about 180 nm, about 10 nm to about 150 nm, about 10 nm to about 120 nm, about 10 nm to about 100 nm, about 10 nm to about 80 nm, about 10 nm to about 60 nm, about 10 nm to about 50 nm, about 10 nm to about 40 nm, about 10 nm to about 20 nm, about 15 nm to about 50 nm, about 20 nm to about 200 nm, about 20 nm to about 180 nm, about 20 nm to about 150 nm, about 20 nm to about 120 nm, about 20 nm to about 100 nm, about 20 nm to about 80 nm, about 20 nm to about 60 nm, about 20 nm to about 50 nm, about 20 nm to about 40 nm, about 20 nm to about 30 nm, about 40 nm to about 200 nm, about 40 nm to about 180 nm, about 40 nm to about 150 nm, about 40 nm to about 120 nm, about 40 nm to about 100 nm, about 40 nm to about 80 nm, about 40 nm to about 60 nm, about 40 nm to about 50 nm, about 50 nm to about 60 nm, about 50 nm to about 150 nm, about 80 nm to about 120 nm, or about 90 nm to about 110 nm.

Embodiments of the present disclosure further relate to any one or more of the following paragraphs 1-23:

1. A method for encapsulating an optical device, comprising: depositing a metallic silver layer on a substrate; depositing a barrier layer on the metallic silver layer, wherein the barrier layer comprises silicon nitride, a metallic element, a metal nitride, or any combination thereof; and depositing an encapsulation layer comprising silicon oxide on the barrier layer.

2. The method according to paragraph 1, wherein the encapsulation layer is deposited by a physical vapor deposition process.

3. The method according to paragraph 2, wherein the physical vapor deposition process comprises generating ozone or an oxygen plasma while depositing the encapsulation layer.

4. The method according to any one of paragraphs 1-3, wherein the metallic silver layer has a thickness of about 10 nm to about 200 nm.

5. The method according to any one of paragraphs 1-4, wherein the barrier layer comprises silicon nitride deposited by physical vapor deposition.

6. The method according to any one of paragraphs 1-5, wherein the barrier layer comprises metallic titanium, metallic chromium, metallic tantalum, metallic tungsten, metallic molybdenum, metallic vanadium, silicon, alloys thereof, dopants thereof, or any combination thereof.

7. The method according to any one of paragraphs 1-6, wherein the barrier layer comprises titanium nitride, tantalum nitride, tungsten nitride, chromium nitride, molybdenum nitride, vanadium nitride, silicon nitride, alloys thereof, dopants thereof, or any combination thereof.

8. The method according to any one of paragraphs 1-7, wherein the barrier layer has a thickness of about 1 nm to about 50 nm.

9. The method according to any one of paragraphs 1-8, wherein the encapsulation layer has a thickness of about 10 nm to about 200 nm.

10. The method according to any one of paragraphs 1-9, wherein the substrate comprises glass, quartz, silicon dioxide, or fused silica.

11. The method according to any one of paragraphs 1-10, further comprising: depositing an intermediate barrier layer on the substrate, wherein the intermediate barrier layer comprises silicon nitride, a metallic element, a metal nitride, or any combination thereof; and depositing the metallic silver layer directly on the intermediate barrier layer.

12. The method according to paragraph 11, wherein the intermediate barrier layer has a thickness of about 1 nm to about 50 nm.

13. A method for encapsulating an optical device, comprising: depositing a first barrier layer on a substrate, wherein the first barrier layer comprises silicon nitride, a metallic element, a metal nitride, or any combination thereof; depositing a metallic silver layer on the first barrier layer; depositing a second barrier layer on the metallic silver layer, wherein the second barrier layer comprises silicon nitride, a metallic element, a metal nitride, or any combination thereof; and depositing an encapsulation layer comprising silicon oxide on the second barrier layer by a physical vapor deposition process.

14. An encapsulated optical device, comprising: a first barrier layer disposed on a substrate, wherein the substrate comprises glass, quartz, silicon dioxide, or fused silica, and wherein the first barrier layer comprises silicon nitride, a metallic element, a metal nitride, or any combination thereof; a metallic silver layer disposed on the first barrier layer; a second barrier layer disposed on the metallic silver layer, wherein the second barrier layer comprises silicon nitride, a metallic element, a metal nitride, or any combination thereof; and an encapsulation layer comprising silicon oxide disposed on the second barrier layer.

15. The encapsulated optical device according to paragraph 14, wherein the encapsulation layer is deposited by a physical vapor deposition process.

16. The encapsulated optical device according to paragraph 14 or 15, wherein the physical vapor deposition process comprises generating ozone or an oxygen plasma while depositing the encapsulation layer.

17. The encapsulated optical device according to any one of paragraphs 14-16, wherein the metallic silver layer has a thickness of about 10 nm to about 200 nm.

18. The encapsulated optical device according to any one of paragraphs 14-17, wherein the first barrier layer and/or the second barrier layer independently comprises silicon nitride deposited by physical vapor deposition.

19. The encapsulated optical device according to any one of paragraphs 14-18, wherein each of the first barrier layer and the second barrier layer independently comprises metallic titanium, metallic chromium, metallic tantalum, metallic tungsten, metallic molybdenum, metallic vanadium, silicon, alloys thereof, dopants thereof, or any combination thereof.

20. The encapsulated optical device according to any one of paragraphs 14-19, wherein each of the first barrier layer and the second barrier layer independently comprises titanium nitride, tantalum nitride, tungsten nitride, chromium nitride, molybdenum nitride, vanadium nitride, silicon nitride, alloys thereof, dopants thereof, or any combination thereof.

21. The encapsulated optical device according to any one of paragraphs 14-20, wherein each of the first barrier layer and the second barrier layer independently has a thickness of about 1 nm to about 50 nm.

22. The encapsulated optical device according to any one of paragraphs 14-21, wherein the encapsulation layer has a thickness of about 10 nm to about 200 nm.

23. The encapsulated optical device according to any one of paragraphs 14-22, wherein the substrate comprises glass, quartz, silicon dioxide, or fused silica.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for encapsulating an optical device, comprising:
   depositing a metallic silver layer on a substrate;
   depositing a barrier layer on the metallic silver layer, wherein the barrier layer comprises a metal nitride, and wherein the barrier layer has a lower surface opposite an upper surface, and the lower surface is directly deposited on the metallic silver layer; and
   depositing an encapsulation layer comprising silicon oxide directly on the upper surface of the barrier layer.

2. The method of claim 1, wherein the encapsulation layer is deposited by a physical vapor deposition process.

3. The method of claim 2, wherein the physical vapor deposition process comprises generating ozone or an oxygen plasma while depositing the encapsulation layer.

4. The method of claim 1, wherein the metallic silver layer has a thickness of about 10 nm to about 200 nm.

5. The method of claim 1, wherein the barrier layer further comprises silicon nitride deposited by physical vapor deposition.

6. The method of claim 1, wherein the barrier layer comprises titanium nitride, tantalum nitride, tungsten nitride, chromium nitride, molybdenum nitride, vanadium nitride, alloys thereof, dopants thereof, or any combination thereof.

7. The method of claim 1, wherein the barrier layer has a thickness of about 1 nm to about 50 nm.

8. The method of claim 1, wherein the encapsulation layer has a thickness of about 10 nm to about 200 nm.

9. The method of claim 1, wherein the substrate comprises glass, quartz, silicon dioxide, or fused silica.

10. The method of claim 1, further comprising:
    depositing an intermediate barrier layer on the substrate, wherein the intermediate barrier layer comprises a metal nitride; and
    depositing the metallic silver layer directly on the intermediate barrier layer.

11. The method of claim 10, wherein the intermediate barrier layer has a thickness of about 1 nm to about 50 nm.

12. The method of claim 1, wherein the metallic silver layer contains about 75 atomic percent (at %) to 99 at % of metallic silver.

13. The method of claim 1, wherein the substrate comprises a high refractive index material, and wherein the high refractive index material has a refractive index of greater than 1.5 to about 2.8.

14. A method for encapsulating an optical device, comprising:
depositing a first barrier layer on a substrate, wherein the first barrier layer comprises a metal nitride;
depositing a metallic silver layer on the first barrier layer;
depositing a second barrier layer on the metallic silver layer, wherein the second barrier layer comprises a metal nitride, and wherein the second barrier layer has a lower surface opposite an upper surface, and the lower surface is directly deposited on the metallic silver layer; and
depositing an encapsulation layer comprising silicon oxide directly on the upper surface of the second barrier layer by a physical vapor deposition process.

15. The method of claim 14, wherein the physical vapor deposition process comprises generating ozone or an oxygen plasma while depositing the encapsulation layer.

16. The method of claim 14, wherein the metallic silver layer has a thickness of about 10 nm to about 200 nm.

17. The method of claim 14, wherein the first barrier layer or the second barrier layer independently further comprises silicon nitride deposited by physical vapor deposition.

18. The method of claim 14, wherein each of the first barrier layer and the second barrier layer independently comprises titanium nitride, tantalum nitride, tungsten nitride, chromium nitride, molybdenum nitride, vanadium nitride, alloys thereof, dopants thereof, or any combination thereof.

19. The method of claim 14, wherein the metallic silver layer contains about 75 atomic percent (at %) to 99 at % of metallic silver.

20. The method of claim 14, wherein the substrate comprises a high refractive index material, and wherein the high refractive index material has a refractive index of greater than 1.5 to about 2.8.

* * * * *